United States Patent [19]

Akaogi

[11] Patent Number: 5,091,888
[45] Date of Patent: Feb. 25, 1992

[54] SEMICONDUCTOR MEMORY DEVICE

[75] Inventor: Takao Akaogi, Tokyo, Japan

[73] Assignee: Fujitsu Limited, Kawasaki, Japan

[21] Appl. No.: 552,972

[22] Filed: Jul. 12, 1990

[30] Foreign Application Priority Data

Jul. 13, 1989 [JP] Japan .................. 1-183081

[51] Int. Cl.⁵ .............................. G11C 7/00
[52] U.S. Cl. .................. 365/210; 365/189.09
[58] Field of Search .......... 365/207, 208, 210, 185, 365/189.09

[56] References Cited

U.S. PATENT DOCUMENTS 4,648,074  3/1987  Pollachek .............. 365/210 X
4,884,241  11/1989  Tanaka et al. ........... 365/210

Primary Examiner—Joseph A. Popek
Attorney, Agent, or Firm—Armstrong, Nikaido, Marmelstein, Kubovcik & Murray

[57] ABSTRACT

A semiconductor memory device comprises memory cells for storing data, reference cells for storing reference data, and an output part supplied with an output signal from the memory cells and a reference signal from the reference cells for comparing the output signal and the reference signal and producing an output signal of the semiconductor memory device indicative of the data stored in the memory cell means on the basis of the comparison. In the present invention, the reference cell includes a plurality of reference cell transistors connected in parallel with each other for storing the reference data such that a same reference data is stored in each of the reference cell transistors.

9 Claims, 4 Drawing Sheets

SEMICONDUCTOR MEMORY DEVICE

BACKGROUND OF THE INVENTION

The present invention generally relates to semiconductor devices and more particularly to a so-called reference cell type semiconductor memory device for storing data in a memory cell, wherein the content of the data stored in the memory cell is identified by comparing an output of the memory cell with an output of a reference cell.

In the field of the semiconductor memory devices such as the non-volatile semiconductor memory devices in particular, so-called reference cell type memory devices are used for reducing the access time. In such a reference cell type memory devices, the identification of the data stored in the memory cell is made on the basis of comparison with the output of a reference cell.

In such non-volatile, reference cell type semiconductor memory devices, efforts are made to increase the integration density, and the size of the transistors forming the memory cells is miniaturized more and more. The transistors forming the reference cells are no exception. In such a non-volatile semiconductor device, there arises a problem such that the size of the transistors forming the reference cells tends to be varied particularly with respect to the gate length, gate width and the like depending on the fabrication process. In the transistors having an extremely miniaturized size, small variation in the gate length, gate width, etc. may cause a significant change in the device characteristic of the transistor.

FIG. 1 shows an example of a conventional erasable programmable read-only memory (EPROM). The memory device comprises a memory part 1 including a memory cell, a reference part 2, and an output part 3, wherein the reading of data from the memory cell is made on the basis of comparison of an output voltage $V_M$ of the memory part 1 with a reference voltage $V_R$ produced by the reference part 2.

Referring to FIG. 1, the memory part 1 includes a p-channel MOS transistor 11 acting as a load resistance, an n-channel MOS transistor 12 for bit line biasing to be described later, an n-channel MOS transistor 13 for the column selection, and a memory cell 14 made of a floating gate type MOS transistor and acting as the memory cell. The MOS transistor 11 has its source connected to a power terminal 15 to which a drain voltage $V_{DD}$ of typically 5 volts is applied. Further, the MOS transistor 11 has a gate connected to an output terminal 16 of the memory part 1. The MOS transistor 11 has a source connected to its gate and the source of the MOS transistor 11 is connected further to a source of the MOS transistor 12. This MOS transistor 12 is used for biasing a bit line BL which is connected to a source of the memory cell 14 such that the injection of electrons into the floating gate of the memory cell 14 does not occur at the time of reading the data. For this purpose, a gate voltage of 1.2 volts is applied to the gate of the MOS transistor 12 via an input terminal 17 and in response thereto, the voltage of the bit line BL is set to be 0.9 volts. Thereby, the source voltage of the memory cell 14 is also set to be 0.9 volts. The MOS transistor 12 has its drain connected to the source of a MOS transistor 13 which is used for the column selection.

The MOS transistor 13 has a gate connected to the column bus 18 and a drain connected to the source of the memory cell 14 via the bit line BL. Thereby, the MOS transistor 13 supplies the foregoing bit line voltage to the drain of the memory cell 14 via the bit line BL in response to a column selection signal on the column bus 18. The memory cell 14 is made of a floating gate type MOS transistor having a floating gate and a control gate wherein the control gate is connected to the word line WL. The memory cell 14 further has a drain which is connected to the ground and stores the logic data "0" in response to the injection of the electrons into the floating gate. When the electrons are not injected, the memory cell 14 stores the logic data "1". When the memory cell 14 stores the data "0", the MOS transistor forming the cell 14 is turned off even when the word line voltage is supplied to the gate via the word line WL while when the logic data "1" is stored, the MOS transistor 14 is turned on in response to the word line voltage.

The MOS transistor 11 acting as the load resistance is fabricated to have a gate width such that a voltage of 4 volts appears at the output terminal 16 as the output voltage $V_M$ when the addressed memory cell 14 stores the logic data "0" while an output voltage of 3 volts appears at the output terminal 16 when the logic data "1" is stored in the memory cell 14.

The reference part 2 includes a p-channel MOS transistor 21 acting as a load resistance, an n-channel MOS transistor 22 for bit line biasing to be described later, an n-channel MOS transistor 23 for the column selection, and a memory cell 24 made of a floating gate type MOS transistor and acting as the memory cell. The MOS transistor 21 has its drain connected to a power terminal 25 to which the source voltage $V_{DD}$ of typically 5 volts is applied. Further, the MOS transistor 21 has a gate connected to an output terminal 26 of the reference part 2. The MOS transistor 21 has a source connected to its gate and the drain of the MOS transistor 21 is connected further to a source of the MOS transistor 22. This MOS transistor 22 is used for biasing a bit line $BL_R$ which is connected to a source of the memory cell 24 such that the injection of electrons into the floating gate of the memory cell 24 does not occur at the time of reading the data. For this purpose, a gate voltage of 1.2 volts is applied to the gate of the MOS transistor 22 via an input terminal 27 and in response thereto, the voltage of the bit line BL is set to be 0.9 volts. Thereby, the source voltage of the memory cell 24 is also set to be 0.9 volts. The MOS transistor 22 has its drain connected to the source of a MOS transistor 23 which is used for the column selection.

The MOS transistor 23 has a gate connected to the source voltage $V_{DD}$ and a drain connected to the source of the memory cell 24 via the bit line $BL_R$ and supplies the foregoing bit line voltage of 0.9 volts to the source of the memory cell 24. The memory cell 24 is made of a floating gate type MOS transistor similarly to the memory cell 14 and has a control gate connected to the word line WL in addition to the floating gate. The memory cell 24 further has a drain which is connected to the ground and stores the logic data "1". In response to the data "1" stored in the memory cell 24, the MOS transistor forming the cell 24 is turned on. It should be noted that the MOS transistor of the memory cell 24 is always biased by the source voltage $V_{DD}$ supplied to its gate.

The MOS transistor 21 acting as the load resistance is fabricated to have a gate width such that a voltage of 3.5 volts appears at the output terminal 26 as the output voltage $V_R$. This voltage of 3.5 volts is the voltage intermediate between the voltage of 4.0 volts which is the value of $V_M$ for the case where the data "0" is stored in the cell 14 and 3.0 volts which is the value of $V_M$ for the case where the data "1" is stored in the memory cell 14. The foregoing relationship between the voltage $V_M$ and the voltage $V_R$ may be obtained by setting the gate width of the MOS transistor 21 twice as large as the gate width of the MOS transistor 11 when the memory cell 14 and the memory cell 24 have a same size with respect to the gate length, gate width and the like.

The output circuit part 3 includes a differential amplifier 31 having an inverting input terminal connected to the output terminal 16 of the memory part 1 and a non-inverting input terminal connected to the output terminal 26 of the reference part 2. Further, the differential amplifier 31 has an output terminal connected to a data output terminal 32 of the memory device.

When reading data from the memory cell 14, the memory cell 14 is addressed in response to the column selection signal on the column bus 18 and the word line voltage on the word line WL, and the voltage on the bit line BL is changed depending on whether the data "1" is stored in the memory cell 14 or the data "0" is stored therein. The differential amplifier 31 produces either a low level output L in response to the output voltage $V_M$ of 4 volts corresponding to the data "0" stored in the memory cell 14 or a high level output H in response to the output voltage $V_M$ of 3 volts corresponding to the data "1" stored in the memory cell 14 on the basis of the comparison with the reference voltage $V_R$ which is set to be 3.5 volts as already described. In other words, the identification of the content of the data stored in the memory cell 14 can be performed on the basis of detection of the variation of the output voltage $V_M$ of only 1 volt. Thereby, a quick identification can be performed with respect to the content of the data and the access time for reading the data out from the memory cell 14 is significantly reduced.

In the foregoing conventional memory device, there arises a problem, associated with the requirement of miniaturization of the transistors forming the memory device, that a slight variation in the size of the memory cell, particularly the memory cell 24 in the reference part 2, with respect to the gate length or gate width, may cause a significant variation in the characteristic of the memory cell. When the reference voltage $V_R$ is changed, there is a substantial risk that an erroneous reading of the data is made or a relatively long time is needed in order to read the data with reliability.

SUMMARY OF THE INVENTION

Accordingly, it is a general object of the present invention to provide a novel and useful semiconductor memory device wherein the foregoing problems are eliminated.

Another object of the present invention is to provide a semiconductor memory device having a construction for facilitating a quick reading of data and yet suitable for increasing the integration density.

Another object of the present invention is to provide a semiconductor memory device having a construction wherein the miniaturization of the memory device can be performed without deteriorating the access time.

Another object of the present invention is to provide a semiconductor memory device of the reference cell type wherein an excellent access time is guaranteed even when there is a variation in the characteristic of the reference cells.

Another object of the present invention is to provide a semiconductor memory device, comprising: memory cell means for storing data, said memory cell means being supplied with an address signal and producing an output signal indicative of the data stored therein in response to the address signal; reference cell means for storing reference data, said reference cell means producing a reference signal indicative of the reference data stored therein; and output means supplied with the output signal and the reference signal respectively from the memory cell means and the reference cell means for producing an output signal indicative of the data stored in the memory cell means; wherein said reference cell means comprises a plurality of transistors connected in parallel with each other for storing the reference data such that the reference data is stored in each of the transistors. According to the present invention, the device-by-device variation of the reference signal is averaged by the use of the plurality of transistors connected parallel with each other and associated therewith, a reliable reading of the data out of the semiconductor device can be achieved with a reduced access time even when the device is miniaturized.

Other objects and further features of the present invention will become apparent from the following detailed description when read in conjunction with the attached drawings.

DETAILED DESCRIPTION

Hereinafter, a first embodiment of the present invention will be described with reference to FIG. 2.

Figure 2:
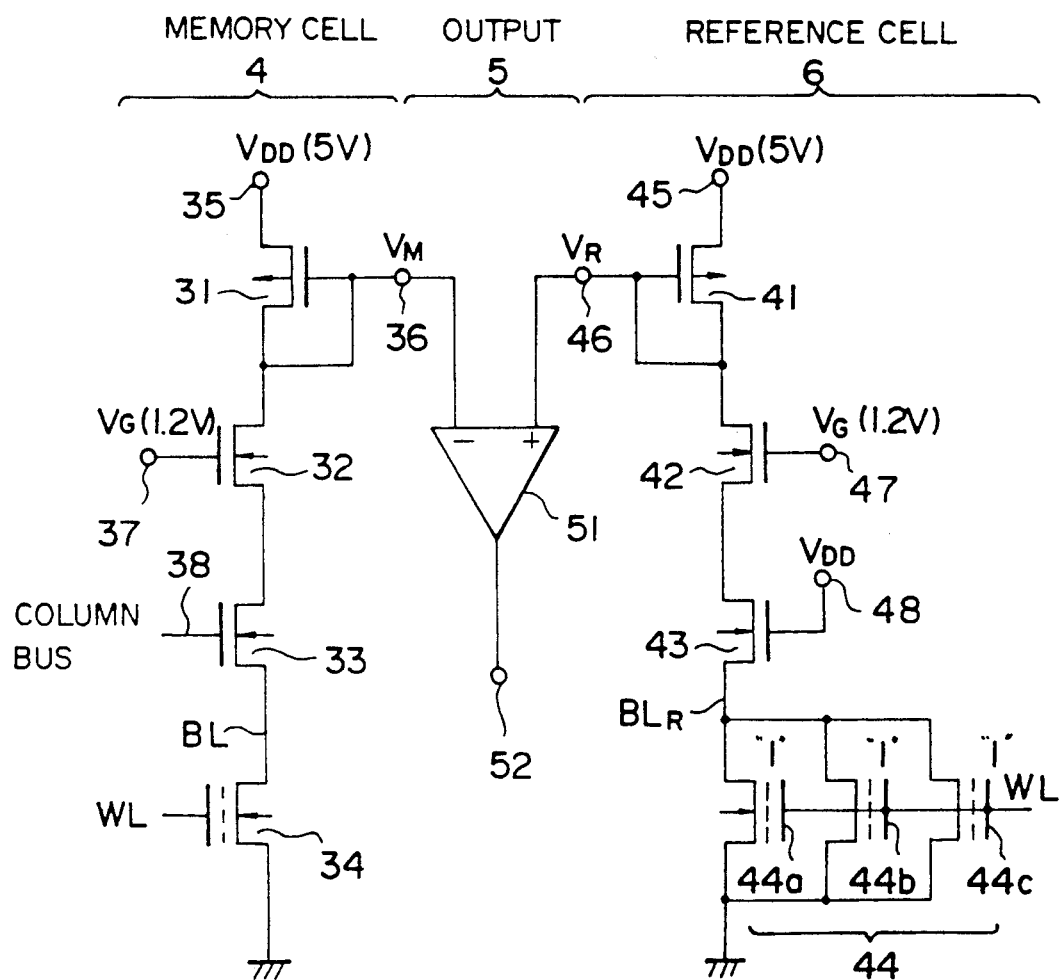
FIG. 2 circuit diagram showing the construction of a semiconductor memory device according to a first embodiment of the present invention.

Referring to FIG. 2, the memory device includes a memory part 4 including a memory cell, a reference part 5 and an output part 6, wherein data is stored in the memory cell and reading of the data from the memory cell is made on the basis of comparison of an output voltage $V_M$ of the memory part 4 with a reference voltage $V_R$ produced by the reference part 6.

Referring to FIG. 2, the memory part 4 includes a p-channel MOS transistor 31 acting as a load resistance, an n-channel MOS transistor 32 for bit line biasing to be described later, an n-channel MOS transistor 33 for the column selection, and a memory cell 34 made of a floating gate type MOS transistor and acting as the memory cell. The MOS transistor 31 has its drain connected to a power terminal 35 to which a source voltage $V_{DD}$ of typically 5 volts is applied. Further, the MOS transistor 31 has a gate connected to an output terminal 36 of the memory part 4. The MOS transistor 31 has a source connected to its gate and the source of the MOS transistor 31 is connected further to a source of the MOS transistor 32. This MOS transistor 32 is used for biasing a bit line BL which is connected to a drain of the memory cell 34 such that the injection of electrons into the floating gate of the memory cell 34 does not occur at the time of reading the data. For this purpose, a gate voltage of 1.2 volts is applied to the gate of the MOS transistor 32 via an input terminal 37 and in response thereto, the voltage of the bit line BL is set to be 0.9 volts. Thereby, the source voltage of the memory cell 34 is also set to be 0.9 volts. The MOS transistor 32 has its drain connected to the drain of a MOS transistor 33 which is used for the column selection.

The MOS transistor 33 has a gate connected to the column bus 38 and a drain connected to the source of the memory cell 34 via the bit line BL. Thus, in response to the column selection signal at the column bus 38, the bit line voltage of 0.9 volts is supplied to the source of the memory cell 34 via the bit line BL. The memory cell 34 is made of a floating gate type MOS transistor having the floating gate and a control gate wherein the control gate is connected to the word line WL. The memory cell 34 further has a drain which is connected to the ground and stores the logic data "0" in response to the injection of the electrons into the floating gate. When the electrons are not injected, the memory cell 34 stores the logic data "1". When the memory cell 34 stores the data "0", the MOS transistor forming the cell 34 is turned off even when the word line voltage and the bit line selection signal are applied to the word line WL and the bit line BL, while when the logic data "1" is stored, the MOS transistor 34 is turned on in response to the word line voltage applied to the word line WL.

The MOS transistor 31 acting as the load resistance is fabricated to have a gate width such that a voltage of 4 volts appears at the output terminal 36 as the output voltage $V_M$ when the addressed memory cell 34 stores the logic data "0" while an output voltage of 3 volts appears at the output terminal 36 when the logic data "1" is stored in the memory cell 34.

The reference cell 6 includes a p-channel MOS transistor 41 acting as a load resistance, an n-channel MOS transistor 42 for bit line biasing to be described later, an n-channel MOS transistor 43 for the column selection, and a memory cell 44 made of a floating gate type MOS transistor and acting as the memory cell. The MOS transistor 41 has its drain connected to a power terminal 45 to which the source voltage $V_{DD}$ of typically 5 volts is applied. Further, the MOS transistor 41 has a gate connected to an output terminal 46 of the reference cell 6. The MOS transistor 41 has a connected to its gate and the source of the MOS transistor 41 is connected further to a source of the MOS transistor 42. This MOS transistor 42 is used for biasing a bit line $BL_R$ which is connected to a source of the memory cell 44 of which construction will be described in detailed later, such that the injection of electrons into the floating gate of the memory cell 44 does not occur at the time of reading the data. For this purpose, a gate voltage of 1.2 volts is applied to the gate of the MOS transistor 42 via an input terminal 47 and in response thereto, the voltage of the bit line BL is set to be 0.9 volts. Thereby, the source voltage of the memory cell 44 is also set to be 0.9 volts. The MOS transistor 42 has its source connected to the drain of a MOS transistor 43 which is used for supplying the foregoing bit line voltage to the source of the memory cell 44. The MOS transistor 43 has a gate connected to the drain voltage $V_{DD}$ and a source connected to the source of the memory cell 44 via the bit line $BL_R$.

In the present invention, the memory cell 44 includes a number of floating gate type MOS transistors 44a, 44b, 44c, . . . connected parallel with each other, wherein each of the MOS transistors has a source connected commonly to the bit line $BL_R$, a control gate connected to a common word line WL, and a drain connected to the ground. Further, each of the MOS transistors 44a, 44b, 44c . . . stores the logic data "1". In response to the data "1" thus stored, the MOS transistors 44a, 44b, 44c . . . are turned on. By using a plurality of FETs 44a-44c connected in parallel as such, the variation of characteristic of the FETs in the memory cell 44 is averaged and one can obtain a stabilized voltage at the output terminal 46 as the reference voltage $V_R$ even when the memory device is miniaturized.

The MOS transistor 41 acting as the load resistance is fabricated to have a gate width such that a voltage of 3.5 volts appears at the output terminal 46 as the output voltage $V_R$. The MOS transistor 41 is fabricated to have a gate width which provides the threshold such that the output voltage $V_R$ of 3.5 volts, which is intermediate between 4.0 volts which is the voltage of $V_M$ for the case where the data "0" is stored in the memory cell 34 and 3.0 volts which is the voltage of $V_M$ for the case where the data "1" is stored in the memory cell 34, is obtained at the output terminal 46.

The output circuit part 5 includes a differential amplifier 51 having an inverting input terminal connected to the output terminal 36 of the memory part 4 and a noninverting input terminal connected to the output terminal 46 of the reference part 6. Further, the differential amplifier 51 has an output terminal connected to a data output terminal 52 of the memory device.

Figure 1:
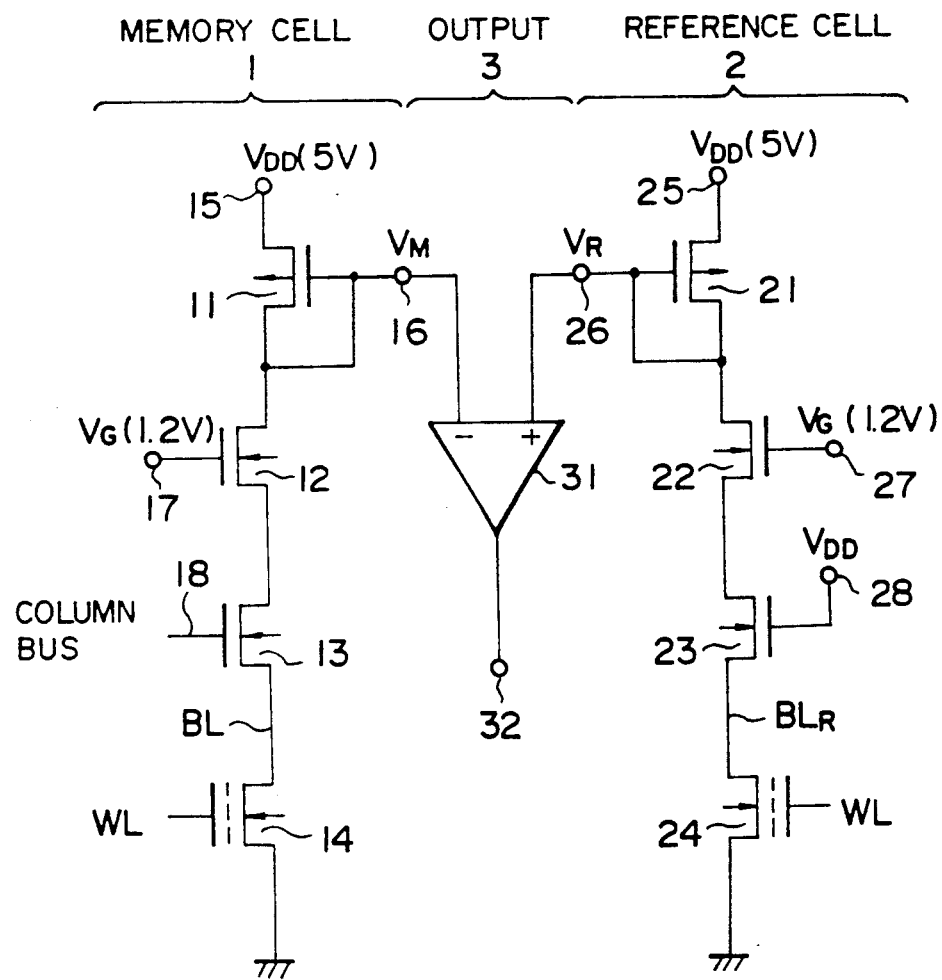
FIG. 1 is a circuit diagram showing the construction of a semiconductor memory device.

In the present invention, it should be noted that the increase in the number of FETs forming the memory cell 44 causes an increase of current flowing through the bit line $BL_R$. Thus, in correspondence to the increase of the current, the gate width of the FET 41 acting as the load resistance has to be increased by a multiple of the number of the FETs used in the memory cell 44 so that the output voltage $V_R$ of 3.5 volts is maintained at the output terminal 46. In the case of the conventional memory device shown in FIG. 1, the gate width of the FET 21 is chosen to be two times as large as the gate width of the MOS transistor 11 as already described. In the case of the present invention where the number of the FETs in the memory cell 44 is three as in the illustrated example, the FET 41 has to have the gate width which is six times as large as the gate width of the FET 31.

In operation, the memory cell 34 is addressed in response to the word line voltage on the word line WL and the column selection signal on the column bus 38, and the change in the output voltage $V_M$ at the output terminal 36 occurring in response to the change of the bit line voltage on the bit line BL, which change in turn occurs in response to the content of the data stored in the memory cell 34, is detected by the differential amplifier 51 on the basis of the comparison with the output voltage $V_R$ at the output terminal 46. This output voltage $V_R$ is obtained by sending the word line voltage on the word line WL simultaneously to the gate of the FETs 44a-44c.

Thus, when the content of the data in the memory cell 34 is "1", the FET forming the memory cell 34 is turned on and the voltage $V_M$ assumes the value of 3 volts, whereby the differential amplifier 51 produces a low level output L at the output terminal indicative of the logic data "1" on the basis of comparison with the voltage $V_R$ at the output terminal 46. On the other hand, when the content of the data in the memory cell 34 is "0", the FET forming the memory cell 34 is turned off and the voltage $V_M$ assumes the value of 4 volts. In response to this, the differential amplifier 51 produces a high level output H at the output terminal indicative of the logic data "0" on the basis of the comparison with the voltage $V_R$.

As the memory device of the present invention can provide a stabilized voltage for the reference voltage $V_R$, the memory device can operate effectively even when the transistors forming the device are miniaturized. In other words, the present invention provides a semiconductor memory having a reduced access time and capable of operating with reliability even when the device is miniaturized and the integration density increased.

Figure 3:
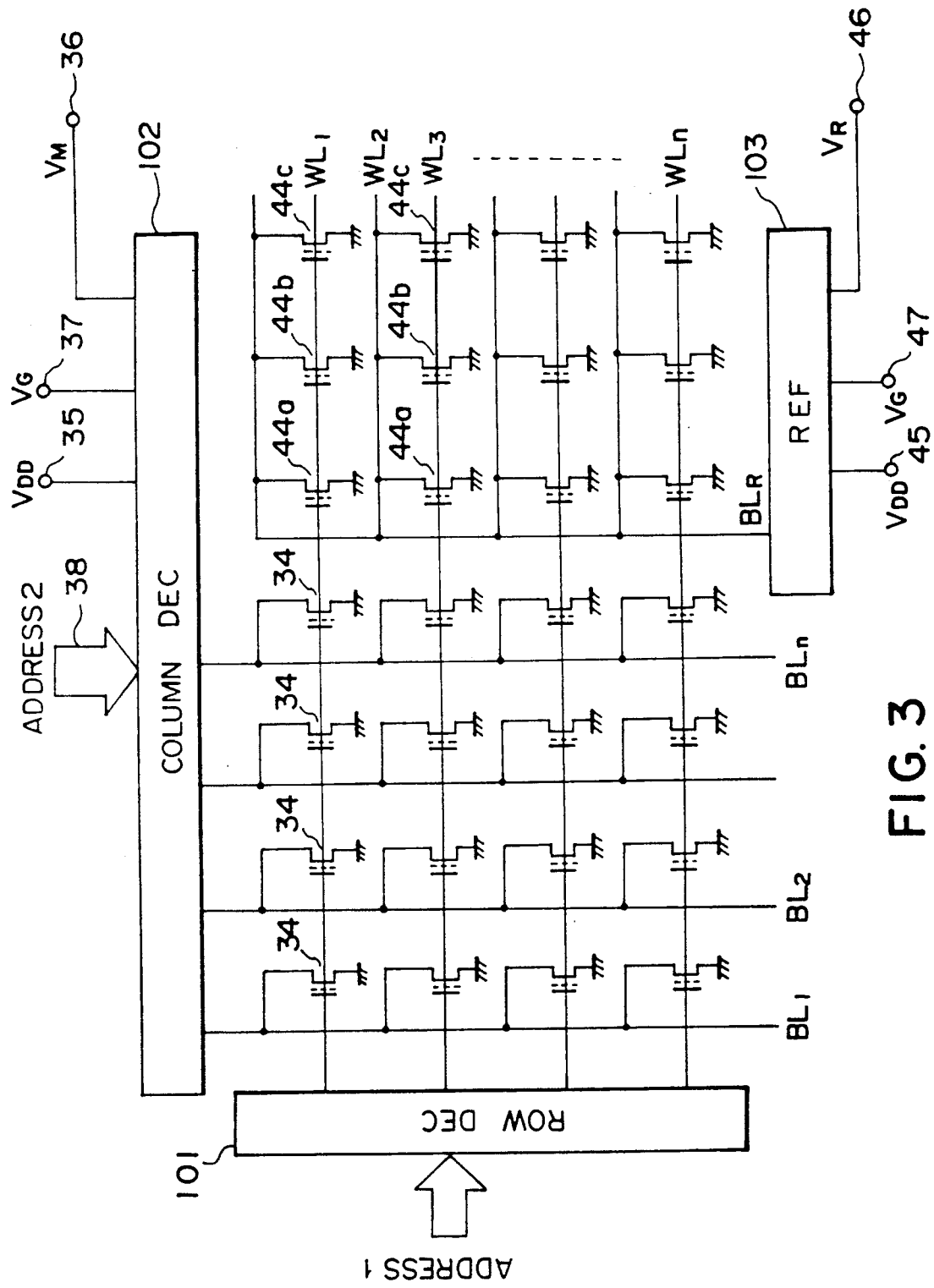
FIG. 3 is a block diagram showing an overall construction of the memory cell device of FIG. 2.

FIG. 3 shows an overall construction of the memory device of FIG. 2 wherein the memory cell 34 and the memory cell 44 are arranged in a form of cell array.

Referring to FIG. 3, there are provided a plurality of bit lines BL1-BLn for the memory cell 4 and a plurality of word lines WL1-WLn for the reference cell 6. The floating gate MOS transistors forming the memory cell 34 are disposed in correspondence to the intersections of the bit lines BL1-BLn and the word lines WL1-WLn. The word lines WL1-WLn are connected to a usual row decoder 101 which is not shown in FIG. 2. The row decoder 101 is supplied with a first address data ADDRESS1 and supplies the word line voltage selectively to one of the word lines WL1-WLn specified by the first address data. As the row decoder 101 does not constitute a part of the present invention, further description will be omitted.

The bit lines BL1-BLn are connected to a column decoder 102 which is supplied with a second address data ADDRESS2 corresponding to the column selection signal via the column bus 38, and the column decoder 102 supplies the predetermined bit line voltage of 0.9 volts selectively to one of the bit lines specified by the second address data ADDRESS2. Further, the column decoder 102 includes the FETs 31, 32, 33 and 34 connected as shown in FIG. 2 in correspondence to each of the bit lines BL1-BLn. Thus, the source voltage $V_{DD}$ is supplied to the column decoder 102 via the terminal 35, the gate voltage $V_G$ is supplied to the decoder 102 via the terminal 37 and the output voltage $V_M$ of the memory cell 34 is obtained at the output terminal 36 connected to the column decoder 102.

Further, there is provided a reference drive circuit 103 corresponding to the reference part 6 for supplying the bit line voltage to the field effect transistors 44a-44c forming the memory cell 44 and for producing the reference output voltage $V_R$ at the output terminal 46. It should be noted that each of the word lines WL1-WLn has the transistors 44a-44c connected thereto and the transistor 44a-44c form a part of the memory cell array.

Figure 4:
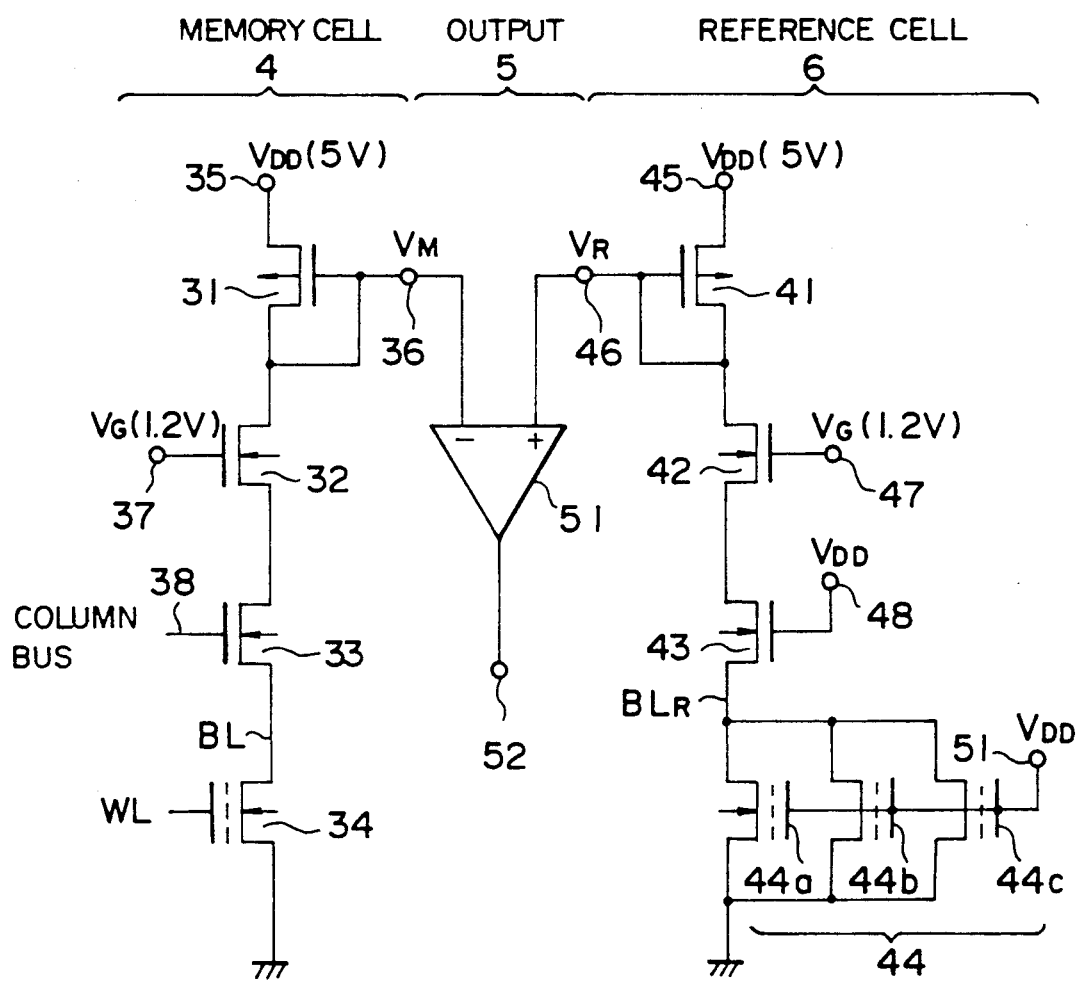
FIG. 4 is a circuit diagram showing the construction of a semiconductor memory device according to a second embodiment of the present invention.

FIG. 4 shows a second embodiment of the present invention. In FIG. 4, the parts corresponding to those already described with reference to FIG. 2 are given identical reference numerals and the description thereof will be omitted.

In this embodiment, the gate of the FETs 44a-44c forming the memory cell 44 is connected commonly to an input terminal 51 to which the source voltage $V_{DD}$ is supplied. As the memory cell 44 is not addressed by the signal on the word line WL, the reference voltage $V_R$ is always at the output terminal 46 and the access time of the memory device can be reduced even further.

In the foregoing embodiments, it should be realized that the number of the MOS transistors forming the memory cell 44 is not limited to three but may be two or more than three. Further, the channel width of the MOS transistor 41 is not limited to two times the integer multiple of the gate width of the MOS transistor 31 with the integer multiplier equal to the number of MOS transistors forming the memory cell 44, but may be any value as long as the current flowing through the bit line $BL_R$ is maintained that the reference voltage $V_R$ at the terminal 46 is set intermediate between the voltage $V_M$ for the case of the data "1" stored in the memory cell 34 and the voltage $V_M$ for the case of the data "0" stored in the memory cell 34.

In this embodiment, the transistor 34 and the transistors 44a-44c are arranged to form a memory cell array similar to FIG. 3 except that the word lines WL1-WLn in the reference part 6 are disconnected from the word lines in the memory part 4 and connected to the voltage source $V_{DD}$ at the terminal 48. As other construction and operation are identical to those of FIG. 3, further description with reference to the drawing similar to FIG. 3 will be omitted.

Although the present invention has been described heretofore on the assumption that the memory cell transistors 34, 44a, 44b and 44c are the floating gate MOS transistor, it will be understood that the type of the memory cell transistor is by no means limited to the floating gate transistor but any other transistor or transistor circuit may be employed.

Further, the present invention is not limited to the embodiments described heretofore but various variations and modifications may be made without departing from the scope of the invention.

What is claimed is:

1. A semiconductor memory device, comprising:
a memory cell array including a plurality of memory cells for storing data, a plurality of word lines, and a plurality of bit lines, each of said memory cells comprising a memory cell transistor connected to a corresponding work line and a corresponding bit line;
addressing means supplied with address data for selecting one of the word lines and one of the bit lines, said addressing means including a word line driver that activates a selected word line by supplying a word line voltage to the selected word line;
said memory cell array producing an output signal indicative of the data stored in the memory cell in response to addressing by the addressing means;
a reference cell array including a plurality of reference cells for storing reference data, a reference word line, and a reference bit line, each of said reference cells comprising a reference cell transistor that is connected commonly to the reference word line and the reference bit line, said reference cell transistor being further connected in parallel to the reference cell transistors that are connected commonly to the same reference word line;
means for activating the reference word line by supplying a word line voltage thereto;
said reference cell array producing a reference output signal indicative of the reference data in response to the activation of the reference word line; and
output means supplied with the output signal from the memory cell array and the reference output signal from the reference cell array for producing a data output indicative of the data stored in the memory cell array based upon a comparison between the output signal of the memory cell array and the reference output signal of the reference cell array.

2. A semiconductor memory device as claimed in claim 1 in which said memory cell transistors and reference cell transistors comprise a floating gate metal-oxide-semiconductor transistor.

3. A semiconductor memory device as claimed in claim 1 wherein said addressing means includes a bit line driver that activates the bit lines with a bit line voltage having a level determined not to cause erroneous writing when reading the data, said bit line drive detecting a change in the bit line voltage when a bit line is selected, and producing said output signal of the memory cell array.

4. A semiconductor memory device as claimed in claim 3 wherein said reference memory cell array is provided with a plurality of reference word lines, said plurality of reference cell transistors being arranged into a plurality of groups in correspondence to the plurality of reference word lines, each group of said reference cell transistors including a plurality of memory cell transistors that are connected commonly to the reference word line corresponding to the group.

5. A semiconductor memory device as claimed in claim 4 wherein said reference memory cell array is provided with said plurality of reference word lines in correspondence to, and in connection with each of the plurality of word lines, said word line driver acting as the means for activating the reference word line.

6. A semiconductor memory device as claimed in claim 4 wherein each of said plurality of reference word lines are connected to a constant voltage source.

7. A semiconductor memory device as claimed in claim 4 wherein said reference cell arrray further comprises a reference bit line driver for activating the reference bit line with a reference bit line voltage that is determined not to cause erroneous wiring in the reference cells, said reference bit line driver comprising:

first load means having a first end connected to a voltage source and a second end connected to the reference bit line for supplying said reference bit line voltage to said reference bit line, said bit line driver further comprising second load means having a first end connected to said voltage source and a second end connected to the bit lines for supplying said bit line voltage to said reference bit lines, said memory cell transistor assuming either of first and second states in response to the data that is stored therein, said first and second load means being so provided that said reference output signal has a level intermediate between said first state of the memory cell transistor and said second state of the memory cell transistor.

8. A semiconductor memory device as claimed in claim 7 wherein said first load means comprises a first field effect transistor having a first channel width, said second load means comprises a second field effect transistor having a second channel width, said first channel width being determined to be equal to twice the second channel width, multiplied further by the number of the memory cell transistors that are connected commonly to the reference word line.

9. A semiconductor memory device as claimed in claim 5 wherein said output means comprises a differential amplifier supplied with the output signal from the memory cell array and the reference output signal from the reference memory cell array, for producing the data output with a logic state that is determined based upon the relative relationship in level of said output signal and said reference output signal.

* * * * *